: (12) United States Patent
Hiratsuka et al.

(10) Patent No.: US 6,174,617 B1
(45) Date of Patent: Jan. 16, 2001

(54) COMMUNICATION METHOD, REMAINING CAPACITY CALCULATION METHOD, TOTAL CAPACITY CALCULATION METHOD, OVERCHARGE PROTECTION METHOD, INFORMATION DISPLAY METHOD, AND BATTERY PACK

(75) Inventors: Masaru Hiratsuka; Kazuyuki Morita; Yasuhito Eguchi, all of Kanagawa (JP)

(73) Assignees: Sony Chemicals Corporation; Sony Corporation, both of Tokyo (JP)

( * ) Notice: Under 35 U.S.C. 154(b), the term of this patent shall be extended for 0 days.

(21) Appl. No.: 09/118,942

(22) Filed: Jul. 20, 1998

(51) Int. Cl.$^7$ .................................................. H01M 10/48
(52) U.S. Cl. .................. 429/90; 429/61; 429/7; 320/6; 320/30; 320/48; 340/636
(58) Field of Search .................. 429/90, 91, 92, 429/61, 62, 7, 149, 121, 122; 320/32, 34, 36, 50, 59, 60, 6, 30, 31, 21, 22, 39, 48; 324/434; 340/636

(56) References Cited

U.S. PATENT DOCUMENTS

| | | | |
|---|---|---|---|
| 5,284,719 | * | 2/1994 | Landau et al. ........................ 429/50 |
| 5,454,710 | * | 10/1995 | Landau et al. ........................ 429/50 |
| 5,543,245 | * | 8/1996 | Andrieu et al. ....................... 429/90 |
| 5,547,775 | * | 8/1996 | Eguchi et al. ........................ 429/7 |
| 5,650,712 | * | 7/1997 | Kawai et al. ......................... 320/48 |
| 5,658,682 | * | 8/1997 | Usuda et al. ......................... 429/92 |
| 5,686,815 | * | 11/1997 | Reipur et al. ........................ 320/21 |
| 5,710,501 | * | 1/1998 | Van Phuoc et al. .................. 320/2 |
| 5,747,189 | * | 5/1998 | Perkins ................................. 429/91 |
| 5,898,292 | * | 4/1999 | Takemoto et al. ................... 320/136 |

* cited by examiner

Primary Examiner—Stephen Kalafut
Assistant Examiner—Raymond Alejandro
(74) Attorney, Agent, or Firm—Sonnenschein, Nath & Rosenthal

(57) ABSTRACT

A variety of information is transmitted to an electronic apparatus by using a microcomputer for low-speed processing and with saved power. A CPU acquires detection data of a thermistor, and detection data, such as the terminal voltage or the discharge current of a battery, at intervals of 10 seconds, through respective interfaces, calculates the remaining capacity and the total capacity of the battery, stores the results and the acquired data as transmission data in a RAM, and transmits this stored transmission data at intervals of one second from a communication interface to an electronic apparatus. Since the CPU transmits the data in one direction independently of the operation of the CPU on the electronic apparatus side, it is possible to greatly lower the operating clock of the CPU and to greatly reduce the consumption of power thereof.

15 Claims, 8 Drawing Sheets

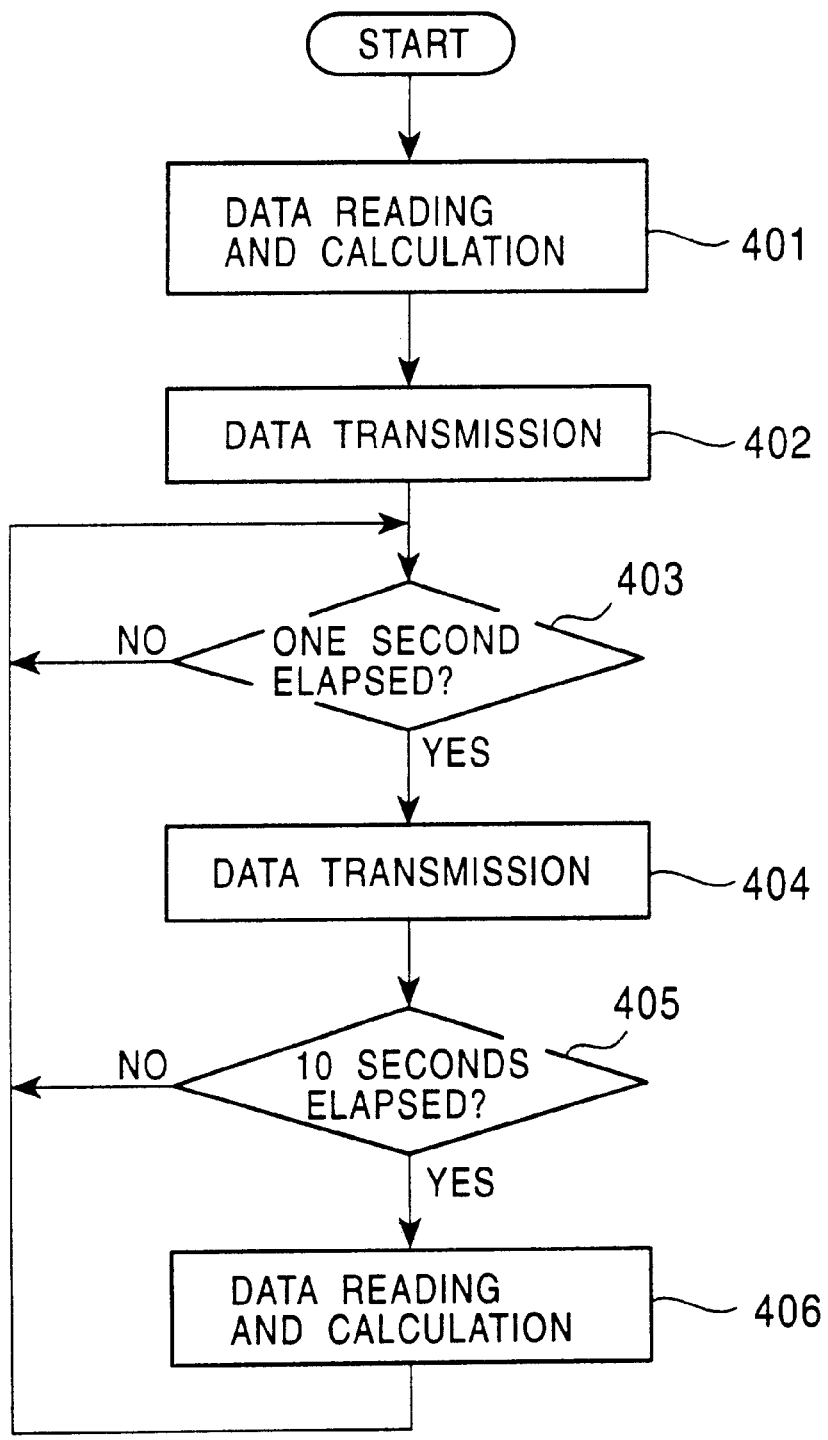

COMMUNICATION METHOD, REMAINING CAPACITY CALCULATION METHOD, TOTAL CAPACITY CALCULATION METHOD, OVERCHARGE PROTECTION METHOD, INFORMATION DISPLAY METHOD, AND BATTERY PACK

BACKGROUND OF THE INVENTION

1. Field of the Invention

The present invention relates to a battery pack in which a secondary battery, a control system for performing charge/discharge control of the secondary battery, and a transmission system for transmitting information on the secondary battery to an electronic apparatus using the secondary battery as a power source are packed into one unit. More particularly, the present invention relates to a remaining capacity calculation method for calculating the remaining capacity of the secondary battery from the data, a total capacity calculation method for calculating the present total capacity of the secondary battery, an overcharge protection method for protecting the secondary battery from excessive voltage (overvoltage) after the control system is reset, and an information display method for displaying information indicating the status and the like of the secondary battery.

2. Description of the Related Art

Conventionally, the main unit of a portable electronic apparatus, such as a video camera, uses a battery pack which is removably loaded as an operating power source, the battery pack being such that a secondary battery (hereinafter referred to simply as a battery), a microcomputer which controls charge/discharge of this battery, and the like are packaged into one unit. A microcomputer 21, such as that shown in FIG. 1, within a main unit 2 of such an electronic apparatus makes an inquiry to a microcomputer 11 of a battery pack 1 through a signal line 3 so that information (data), such as the remaining capacity of the secondary battery inside the battery pack 1, the number of charges/discharges (charge/discharge cycles), the current, the voltage, and various cautions (warnings) are transmitted. In response to this inquiry, when the microcomputer 11 of the battery pack 1 transmits the above-described information that has been acquired thus far by the microcomputer 11 through the signal line 3, the microcomputer 21 receives this information and performs various processing. Therefore, interactive communication is performed between the conventional battery pack 1 and the main unit 2 of the electronic apparatus.

The process performed by the microcomputer 11 of the battery pack 1 for the purpose of acquiring the above-described information includes a process for calculating the capacity remaining (remaining capacity) in the secondary battery. In order to calculate this remaining capacity the microcomputer 11, having a reference table of one discharge curve with no load, calculates the capacity during no load by adjusting for current and temperature on the voltage data during an actual load by referring to this reference table, and transmits this capacity as Wh (or Ah) information to the main unit 2. The main unit 2 adjusts for current and temperature on the received capacity during no load and determines the remaining capacity as time information.

When the microcomputer 11 of the battery pack 1 determines the total capacity after a charge/discharge cycle, conventionally, a ΔV method has been adopted. In this method, current is cut off once during charging, a voltage drop ΔV at that time is read to compute the impedance of the battery, and the total capacity is computed on the basis of the ratio of this result to the initial impedance value of the battery.

When the voltage of the battery falls below a voltage at which the microcomputer 11 can operate normally, the microcomputer 11 of the battery pack 1 enters a state in which the terminal voltage of the battery may not be determined accurately. In the conventional case, even if the microcomputer 11 enters such a state, detection of overvoltage of the battery is performed nonetheless, and overcharge control of the battery is performed.

It is common practice that the main unit of the electronic apparatus checks information indicating the status of the battery, such as the capacity of a conventional battery pack after the battery pack is loaded into the main unit of the electronic apparatus, and then displays the information on a display device or the like connected to the electronic apparatus.

In the interactive communications performed between the conventional battery pack 1 and the main unit 2 of the electronic apparatus and the like into which it is loaded as described above, the battery pack 1 constantly acquires up-to-date information and waits in preparation for an inquiry from the main unit 2. In order to meet such a demand, the microcomputer 11 of the battery pack 1 must perform high-speed processing (the frequency of the operating clock is high). Therefore, there are problems in that an expensive microcomputer must be used and the consumption of power is increased. Also, the main unit can only obtain the information of the battery pack 1 when the main unit makes an inquiry, and a load is correspondingly imposed on the microcomputer 21 on the main unit side.

Furthermore, since two adjustment calculations are performed in the step of determining the remaining capacity of the battery pack 1, calculations become complex, and since the error of adjustment calculations due to, in particular, temperature is large, the calculation accuracy is deteriorated. Furthermore, since this remaining capacity is computed by assuming that the present load conditions continue thereafter, in the worst case of maximum load being applied, the remaining capacity cannot be known, the battery runs out earlier than the computed remaining capacity, and the user becomes perplexed.

In addition, in the computation of the total capacity by the conventional ΔV method, high-accuracy prediction adjustment is required, in particular, for the relationship between temperature versus internal resistance, and the adjustment is complex. Therefore, the accuracy of the computed total capacity is decreased. Since a prediction adjustment is also performed in the calculation for determining the total capacity after a charge/discharge cycle, calculations become complex, and the calculation accuracy is deteriorated.

When the voltage of the battery falls below the reference voltage at which the microcomputer 11 can operate, the overvoltage detection operation for the battery thereafter becomes unstable, and the possibility remains that the battery may be overcharged.

In order to display information indicating the status of the battery of the battery pack, the user must load the battery pack into the main unit, this becomes a burden to the user, and the status of the battery pack cannot be checked in advance.

SUMMARY OF THE INVENTION

The present invention has been achieved in view of such circumstances. A first object of the present invention is to transmit various information to the main unit by using a microcomputer for low-speed processing and with reduced power. A second object of the present invention is to increase the calculation accuracy of the remaining capacity of the battery and the total capacity of the battery after a number of charges/discharges. A third object of the present invention is to compute the remaining capacity of the battery when a maximum load is applied. A fourth object of the present invention is to perform overvoltage detection of the battery reliably where it is safe even if the microcomputer enters an unstable operating state due to a low voltage. A fifth object of the present invention is to make a display of various data indicating the status and the like of the battery with reduced power without burdening the user.

To achieve the above-described objects, according to one aspect of the present invention, there is provided a battery pack comprising: a secondary battery for supplying power to an electronic apparatus; data acquisition means for acquiring data relating to the status and charge/discharge of the secondary battery; and transmission means for transmitting in one direction the data acquired by the data acquisition means to the electronic apparatus which operates using the battery as a power source independently of control from the electronic apparatus.

With such a construction, since the transmission means transmits in one direction data, acquired by the data acquisition means, relating to the status and charge/discharge of the secondary battery independently of control from the electronic apparatus which operates using the battery as a power source, it is not required that the operating clock of the transmission means and the data acquisition means be matched with the operating clock of the electronic apparatus. Therefore, the above-described data acquisition and transmission process can be satisfactorily performed even at a low-frequency operating clock.

Preferably, the data acquisition means acquires the data at predetermined first intervals and updates the data, and the transmission means transmits the data acquired by the data acquisition means to the electronic apparatus at predetermined second intervals shorter than the predetermined first intervals.

With such a construction, the transmission means transmits data relating to the status and charge/discharge of the secondary battery, which is updated at predetermined first intervals, to the electronic apparatus at predetermined second intervals.

Preferably, the data acquisition means performs computations by using acquired data and uses the data resulting from these computations also as the transmission data.

With such a construction, the data acquisition means not only uses as transmission data the directly measured data, but also data computed from the measured data.

According to another aspect of the invention, there is provided a communication method for transmitting data relating to a secondary battery, which supplies power to an electronic apparatus, and data relating to the status and charge/discharge of the battery, to the electronic apparatus using the battery as a power source, the communication method comprising the steps of: acquiring data at predetermined first intervals; and transmitting in one direction the acquired data to the electronic apparatus at predetermined second intervals shorter than the predetermined first intervals, independently of control from the electronic apparatus.

With such a construction, the acquired data relating to the status and charge/discharge of the secondary battery is transmitted in one direction in accordance with a protocol conforming to, for example, a common UART (universal asynchronous receiver/transmitter), independently of the control system of an electronic apparatus which operates using the battery as a power source. Therefore, it is not required that the operating clock at which data transmission and data acquisition are performed be matched with the operating clock of the electronic apparatus, and the above-described data acquisition and transmission process can be satisfactorily performed even at a low-frequency operating clock.

According to a further aspect of the present invention, there is provided a battery pack comprising: a secondary battery for supplying power to an electronic apparatus; storage means for storing a table in which data is held for determining the remaining battery capacity from the terminal voltage of the battery with time being the unit; measurement means for measuring the terminal voltage of the battery; and remaining capacity computation means for determining the remaining capacity of the secondary battery on the basis of the terminal voltage measured by the measurement means by referring to data of the table within the storage means with time being the unit.

With such a construction, the remaining capacity computation means determines the capacity with the remaining time of the secondary battery being the unit by referring to the table data within the storage means on the basis of the terminal voltage measured by the measurement means without performing a plurality of adjustment calculations.

Preferably, the remaining capacity calculation means determines the remaining capacity of the secondary battery by interpolating data held in the table with respect to the terminal voltage of the secondary battery measured by the measurement means, which is not held in the table.

With such a construction, the remaining capacity calculation means determines the remaining capacity of the secondary battery by performing an interpolation calculation only once with respect to the terminal voltage of the secondary battery measured by the measurement means, which is not held in the table.

According to still a further aspect of the present invention, there is provided a remaining capacity calculation method for determining a remaining battery capacity on the basis of a terminal voltage of a secondary battery, the remaining capacity calculation method comprising: a step of measuring the terminal voltage of the secondary battery; and a step of determining the remaining capacity of the secondary battery with time being the unit by referring to a table in which data is held for determining a remaining battery capacity with time being the unit on the basis of the terminal voltage of the secondary battery.

With such a construction, the capacity with the remaining time of the secondary battery being the unit can be determined without performing a plurality of prediction calculations and adjustment calculations by referring to the table data within the storage means on the basis of the measured terminal voltage.

According to still a further aspect of the present invention, there is provided a battery pack comprising: a secondary battery for supplying power to an electronic apparatus; measurement means for measuring a terminal voltage of the secondary battery; remaining capacity computation means for determining the remaining battery capacity on the basis of the terminal voltage of the secondary battery; storage means for storing a maximum load in the repetition number of the previous n discharges; and adjustment means for adjusting the remaining battery capacity determined by the remaining capacity computation means by the maximum load stored in the storage means and for determining the remaining capacity of the secondary battery at the maximum load.

With such a construction, the remaining capacity computation means determines the remaining battery capacity of the secondary battery, and determines the remaining capacity of the secondary battery at the maximum load by adjusting the determined battery capacity by the maximum load.

According to still a further aspect of the present invention, there is provided a remaining capacity calculation method for determining a remaining capacity of a secondary battery, the remaining capacity calculation method comprising: a step of measuring the terminal voltage of the secondary battery; a step of determining the remaining battery capacity on the basis of the terminal voltage; and a step of adjusting the remaining battery capacity by a maximum load in the repetition number of the previous n discharges and determining the remaining capacity of the secondary battery at the maximum load.

With such a construction, the remaining battery capacity of the secondary battery is determined, and by adjusting the determined battery capacity by a maximum load, the remaining capacity of the secondary battery at the maximum load can be determined.

According to still a further aspect of the present invention, there is provided a battery pack comprising: a secondary battery for supplying power to an electronic apparatus; storage means for, during the initial charging of the secondary battery, storing the initial capacity as the capacity charged in the secondary battery while the terminal voltage thereof is increased from a first reference voltage E1V to a second reference voltage E2V, and storing the initial total capacity as the total capacity during the initial charging of the secondary battery; capacity acquisition means for, during the charging of the secondary battery, determining the capacity charged in the secondary battery while the terminal voltage thereof is increased from the first reference voltage E1V to the second reference voltage E2V; and computation means for computing the present total capacity of the secondary battery on the basis of the capacity determined by the capacity acquisition means, the initial capacity, and the initial total capacity stored in the storage means.

With such a construction, when the secondary battery is charged, the capacity acquisition means determines the capacity charged in the secondary battery while the terminal voltage thereof is increased from a first reference voltage E1V to a second reference voltage E2V. The computation means computes, for example, the ratio of the capacity determined by the capacity acquisition means to the initial capacity within the storage means, and computes the present total capacity of the secondary battery by multiplying the initial total capacity within the storage means by the ratio.

According to still a further aspect of the present invention, there is provided a total capacity calculation method for determining the total capacity of a secondary battery at the present time, the total capacity calculation method comprising: a storing step of, during the initial charging of the secondary battery, storing the initial capacity as the capacity charged in the secondary battery while the terminal voltage thereof is increased from a first reference voltage E1V to a second reference voltage E2V, and storing the initial total capacity as the total capacity during the initial charging of the secondary battery; and a step of, during the charging of the secondary battery, determining the capacity charged in the secondary battery while the terminal voltage thereof is increased from the first reference voltage E1V to the second reference voltage E2V, and computing the present total capacity of the secondary battery on the basis of the determined capacity, the prestored initial capacity, and the initial total capacity.

With such a construction, while the terminal voltage of the secondary battery is increased from the first reference voltage E1V to the second reference voltage E2V when the secondary battery is charged, the capacity charged in the secondary battery is determined. Next, the ratio of the determined capacity to the initial capacity within the storage means is computed, and by multiplying the initial total capacity within the storage means by the ratio, the present total capacity of the secondary battery is computed without performing prediction adjustment.

According to still a further aspect of the present invention, there is provided a battery pack comprising: a secondary battery for supplying power to an electronic apparatus; detection means for detecting the terminal voltage of the secondary battery; shut-off means for, when the terminal voltage of the secondary battery becomes an overvoltage, shutting off the charging current to the secondary battery; nonvolatile first storage means for storing a first reference voltage for detecting an overvoltage of the secondary battery; volatile second storage means for storing a second reference voltage for detecting an overvoltage of the secondary battery; and control means for determining, at normal times, an overvoltage of the terminal voltage of the secondary battery detected by the detection means at least by using the second reference voltage stored in the second storage means, and when the voltage of the secondary battery is decreased and the storage of the second storage means is deleted, determining an overvoltage of the terminal voltage of the secondary battery by using the first reference voltage stored in the first storage means, controlling the shut-off means in accordance with the determination result, and shutting off the charging current of the secondary battery.

With such a construction, the control means determines, at normal times, an overvoltage of the terminal voltage of the secondary battery detected by the detection means at least by using the second reference voltage, and when the voltage of the secondary battery is decreased and the storage of the second storage means is deleted, determines an overvoltage of the terminal voltage of the secondary battery by using the first reference voltage stored in the first storage means. Therefore, if the first reference voltage is set to be lower than the second reference voltage, when the storage of the second storage means is deleted, the control means determines the terminal voltage of the secondary battery to be an overvoltage at a voltage lower than at normal times, controls the shut-off means, and shuts off the charging current of the secondary battery early.

Preferably, the first reference voltage is practically lower by a predetermined threshold voltage than a reference voltage for detecting an overvoltage of the secondary battery at normal times.

With such a construction, when the storage of the second storage means is deleted, the control means determines the terminal voltage of the secondary battery to be an overvoltage at a voltage lower than at normal times, controls the shut-off means, and shuts off the charging current of the secondary battery early.

Preferably, the second reference voltage is the threshold voltage, and the control means determines, at normal times, an overvoltage of the terminal voltage of the secondary battery detected by the detection means by comparing it with the sum of the first reference voltage stored in the first storage means and the threshold voltage stored in the second storage means, and when the voltage of the secondary battery is decreased and the storage of the second storage means is deleted, determines an overvoltage of the terminal voltage of the secondary battery by comparing it with the first reference voltage stored in the first storage means.

With such a construction, the control means determines, at normal times, an overvoltage of the secondary battery detected by the detection means by comparing it with the sum of the first reference voltage stored in the first storage means and the threshold voltage stored in the second storage means, and when the voltage of the secondary battery is decreased and the storage of the second storage means is deleted, determines an overvoltage of the secondary battery by comparing it with the first reference voltage stored in the first storage means. Therefore, when the storage of the second storage means is deleted, the control means determines the terminal voltage of the secondary battery to be an overvoltage at a voltage lower than at normal times, controls the shut-off means, and shuts off the charging current of the secondary battery early.

Preferably, the second reference voltage is equal to the sum of the first reference voltage and the threshold voltage, and the control means determines, at normal times, an overvoltage of the terminal voltage of the secondary battery detected by the detection means by comparing it with the second reference voltage stored in the second storage means, and when the voltage of the secondary battery is decreased and the storage of the second storage means is deleted, determines an overvoltage of the terminal voltage of the secondary battery by comparing it with the first reference voltage stored in the first storage means.

With such a construction, the control means determines, at normal times, an overvoltage of the terminal voltage of the secondary battery detected by the detection means by using the second reference voltage stored in the second storage means, and when the voltage of the secondary battery is decreased and the storage of the second storage means is deleted, determines an overvoltage of the terminal voltage of the secondary battery by using the first reference voltage stored in the first storage means. Therefore, when the storage of the second storage means is deleted, the control means determines the terminal voltage of the secondary battery to be an overvoltage at a voltage lower than at normal times, controls the shut-off means, and shuts off the charging current of the secondary battery early.

According to still a further aspect of the present invention, there is provided an overcharge protection method for protecting a battery pack from overcharge, the battery pack comprising a secondary battery for supplying power to an electronic apparatus, and a shut-off section for, when the terminal voltage of the secondary battery becomes an overvoltage, shutting off the charging current of the secondary battery, the overcharge protection method comprising: a step of storing a first reference voltage for detecting an overcharge of the secondary battery in a nonvolatile storage section; a step of storing a second reference voltage for detecting an overcharge of the secondary battery in a volatile storage section; and a step of determining, at normal times, an overcharge of the secondary battery at least by using the second reference voltage, when the voltage of the secondary battery is decreased and the second reference voltage is deleted, determining an overcharge of the secondary battery by using the first reference voltage stored in the nonvolatile storage means, controlling the shut-off means in accordance with the determination result, and shutting off the charging current of the secondary battery.

With such a construction, an overvoltage of the detected terminal voltage of the secondary battery is determined, at normal times, at least by using the second reference voltage stored in the second storage means, and when the voltage of the secondary battery is decreased and the storage of the second storage means is deleted, an overvoltage of the detected terminal voltage of the secondary battery is determined by using the first reference voltage stored in the first storage means. Therefore, if the first reference voltage is set to be lower than the second reference voltage, when the storage of the second storage means is deleted, the terminal voltage of the secondary battery is determined to be an overvoltage at a voltage lower than at normal times, and the charging current of the secondary battery is shut off early.

According to still a further aspect of the present invention, there is provided a battery pack comprising: a secondary battery for supplying power to an electronic apparatus; status detection means for detecting the status of the battery; and display means for displaying information for the secondary battery in accordance with the detection result of the status detection means.

With such a construction, even if the user does not take any action, the display means displays information for the secondary battery in accordance with the status of the secondary battery detected by the status detection means.

According to still a further aspect of the present invention, there is provided an information display method for displaying information of a battery pack comprising a secondary battery for supplying power to an electronic apparatus, and status detection means for detecting the status of the secondary battery, the information display method comprising: a step of displaying information for the secondary battery on the display section provided in the battery pack in accordance with the detection result of the status detection means.

With such a construction, even if the user does not take any action, the information for the secondary battery is displayed in accordance with the status of the secondary battery.

The above and further objects, aspects and novel features of the invention will become more apparent from the following detailed description when read in connection with the accompanying drawings.

BRIEF DESCRIPTION OF THE DRAWINGS

FIG. 5 is a flowchart showing the procedure of a communication process of a CPU shown in FIG. 3.

DESCRIPTION OF THE PREFERRED EMBODIMENT

The preferred embodiment of the present invention will now be described below with reference to the accompanying drawings.

Figure 1:
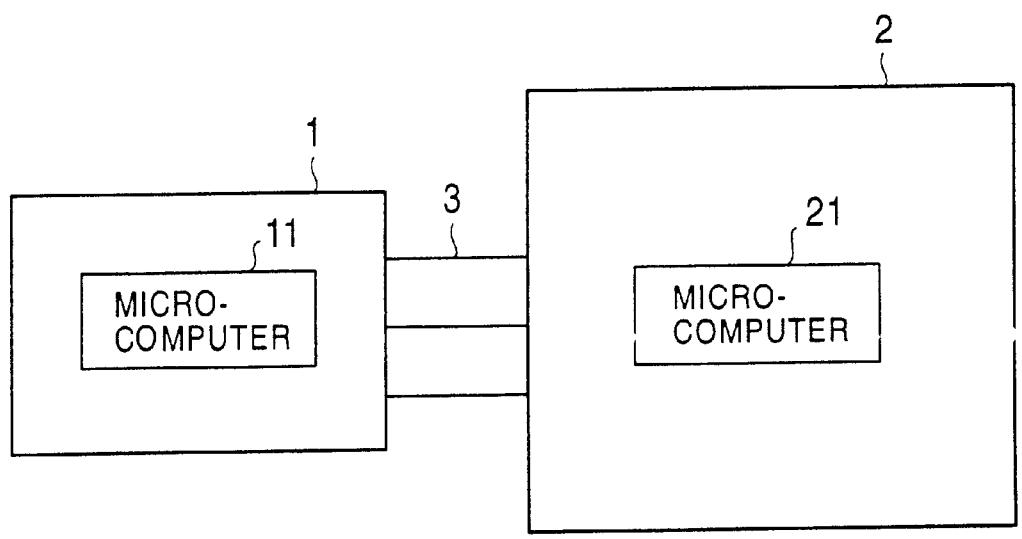
FIG. 1 is a functional block diagram illustrating the relationship between a conventional battery pack and a main unit.
Figure 2:
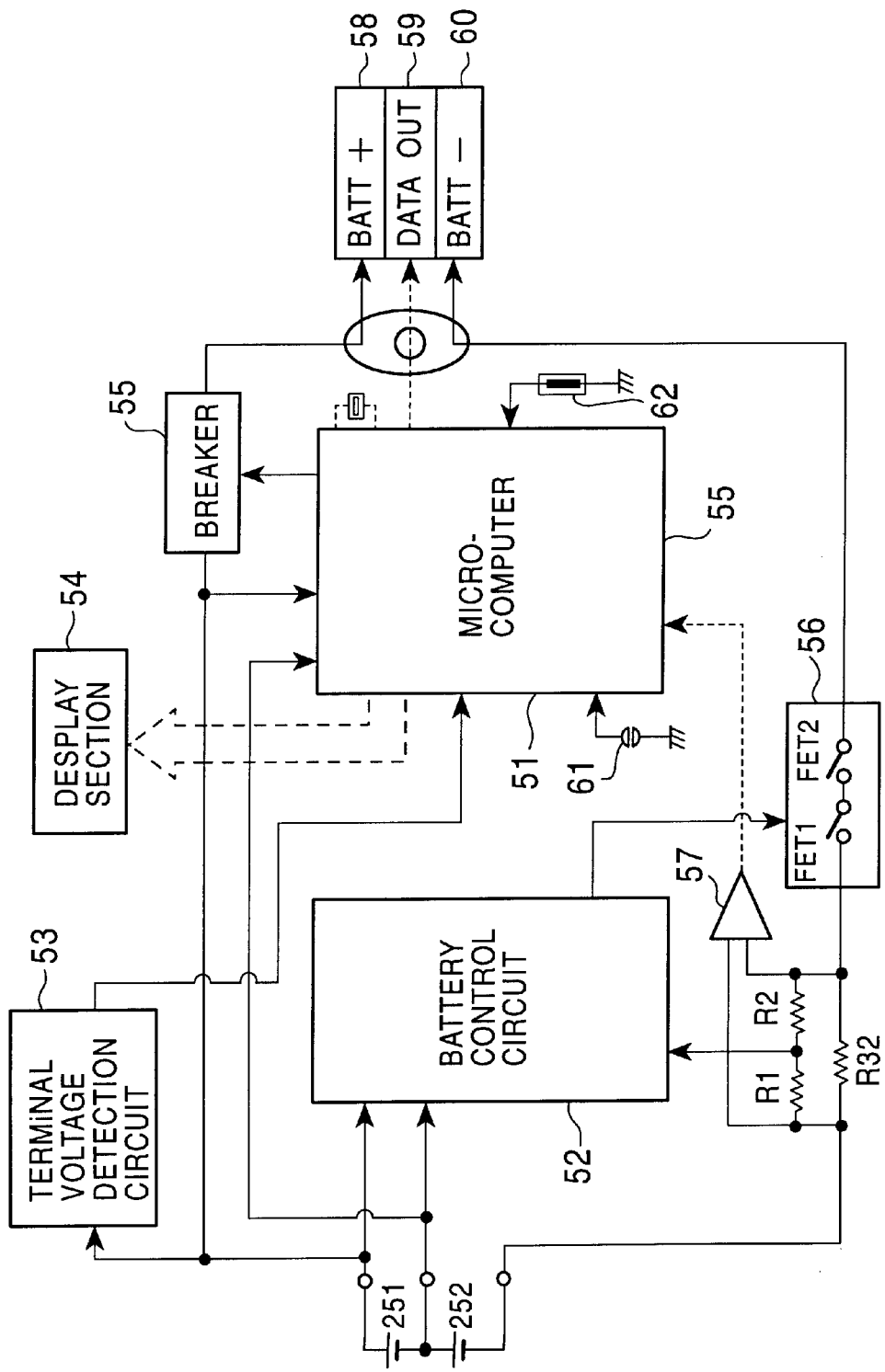
FIG. 2 is a functional block diagram showing the construction of an embodiment of a battery pack according to the present invention.
Figure 8A:
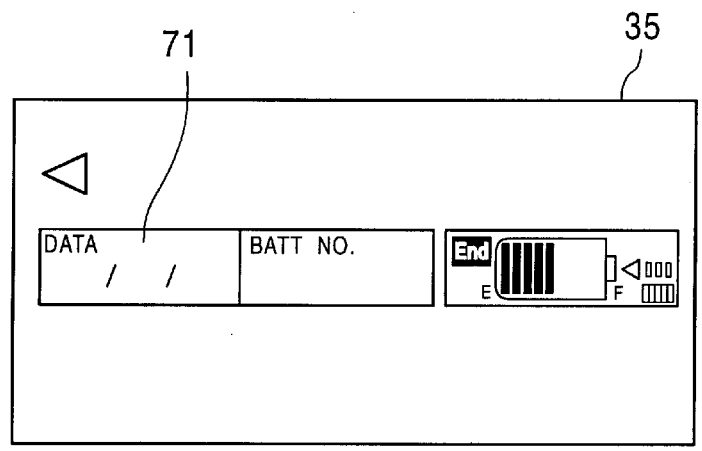
FIGS. 8A, 8B, and 8C show the exterior of the battery pack shown in FIG. 2, and a display section provided on the surface thereof.
Figure 8B:
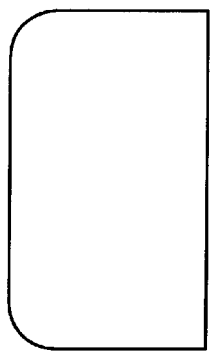
Figure 8C:
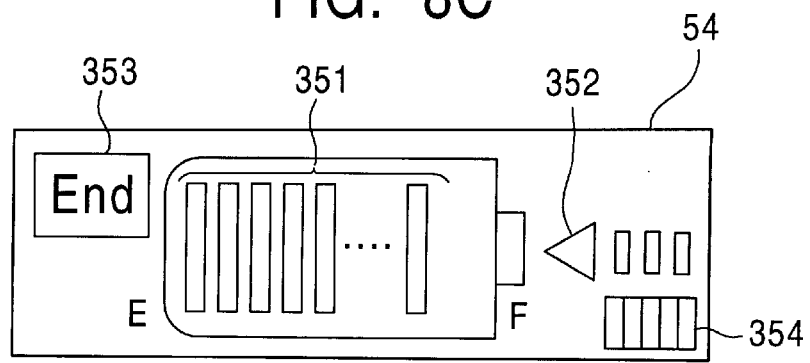

FIG. 2 is a functional block diagram showing an embodiment of a battery pack 35 (the exterior of which is illustrated in FIGS. 8A–8C) according to the present invention. A microcomputer 51 performs communication of information with an electronic apparatus (not shown) corresponding to the main unit 2 of FIG. 1, acquisition of various information and calculations, and display of various information and overvoltage protection. A terminal voltage detection circuit 53 for detecting the terminal voltage of a secondary battery (hereinafter referred to as a battery) 251, and a battery 252 is connected to the microcomputer 51. A display section 54 formed of an LCD (liquid-crystal device) and the like is controlled by the microcomputer 51 and displays the status and the like of the batteries 251 and 252. A breaker 55 finally shuts off the charging/discharging current of the batteries 251 and 252. The output side of an amplifier 57 for amplifying a drop voltage which is generated in a resistor R32 in accordance with the charging/discharging current of the batteries 251 and 252 is connected to the microcomputer 51. A data output terminal 59 for transmitting data to the main unit side is provided to output data output from the microcomputer 51 to an electronic apparatus. An output of an initial calibration value reading process execution terminal 61 and an output of a thermistor 62 for detecting the temperature inside the pack are supplied to the microcomputer 51. This microcomputer 51 forms a secondary protection circuit with respect to the batteries 251 and 252, and operates when a primary protection circuit, which will be described later, does not operate for a particular reason, so that an operation for preventing overvoltage or overcharge of the batteries 251 and 252 is performed.

A battery control circuit 52 monitors the charging/discharging voltage and current of the batteries 251 and 252, performs control for preventing overvoltage and overcharge of these batteries by turning on/off a switch circuit 56, and detects charging/discharging current in accordance with a voltage obtained by dividing an amount of a drop voltage of the resistor R32 by voltage-division resistors R1 and R2. This battery control circuit 52 forms a primary protection circuit with respect to the batteries 251 and 252. The switch circuit 56 is formed such that two switches formed of FET1 (field-effect transistor) and FET2 are connected in series.

Also, the batteries 251 and 252 connected in series are connected at their positive and negative poles to battery terminals 58 and 60 which output discharging current to the main unit (not shown) or to which charging current from a charger (not shown) is input.

Figure 3:
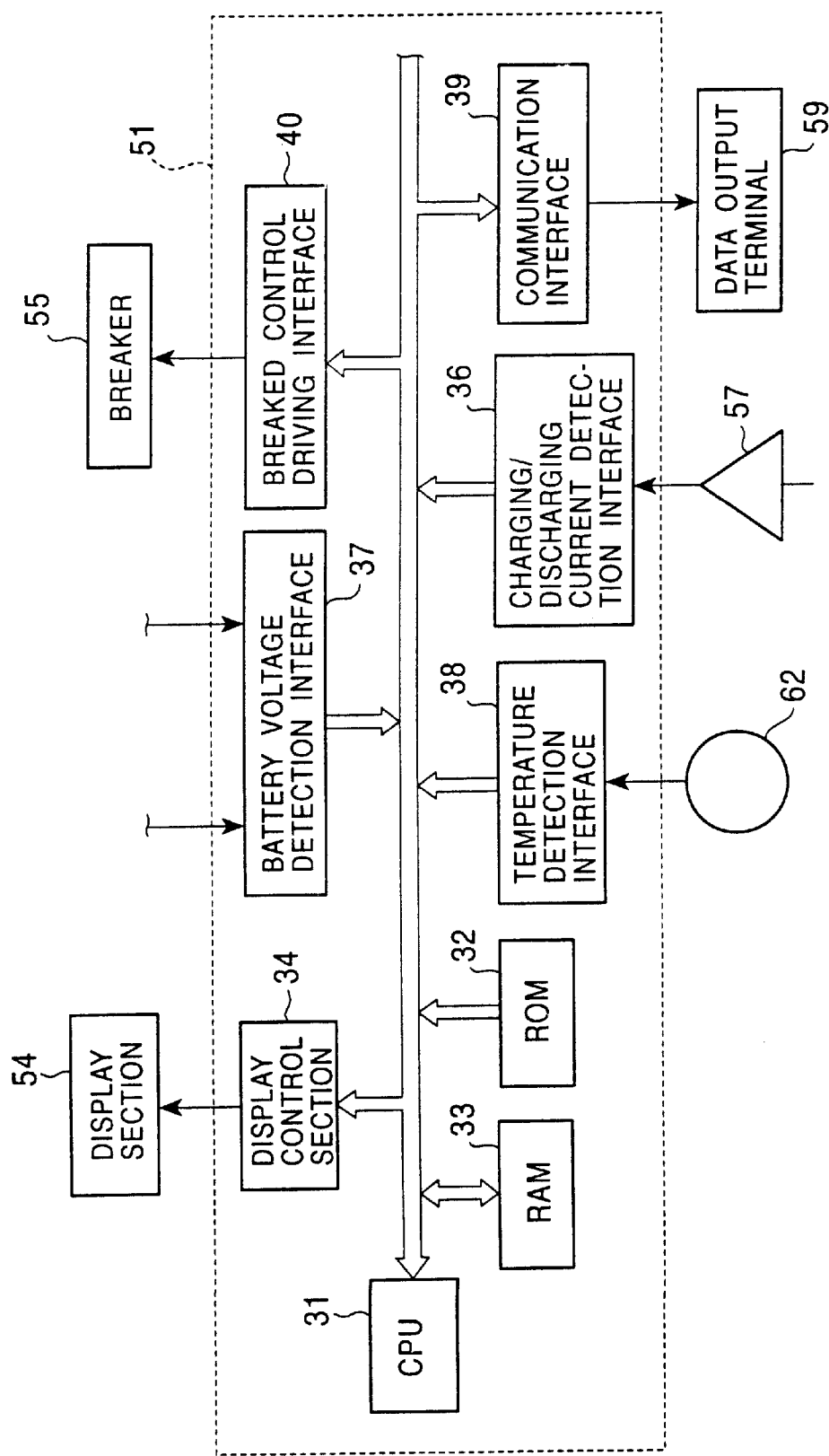
FIG. 3 is a functional block diagram showing a detailed example of the construction of a microcomputer shown in FIG. 2.

FIG. 3 is a functional block diagram showing a detailed example of the construction of the microcomputer 51 shown in FIG. 2. A CPU 31, using a volatile RAM (second storage means) 33 as a work area, executes programs stored in a ROM (first storing means) 32 of a nonvolatile memory so that various operations are performed. As one of these processes, various information is displayed on the display section 54 via a display control section 34. The CPU 31 reads a voltage from the amplifier 57 via a charging/discharging current detection interface 36, and reads each terminal voltage of the batteries 251 and 252 via a battery voltage detection interface 37. Furthermore, the CPU 31 reads the temperature within the pack detected by the thermistor 62 via a temperature detection interface 38, and transmits various data from the data output terminal 59 to the electronic apparatus via a communication interface 39. When an overcharge is detected on the basis of the terminal voltages of the batteries 251 and 252, the CPU 31 controls a breaker control driving interface 40 to cause the breaker 55 to be shut off.

Here, the thermistor 62, the temperature detection interface 38, the resistor R32, the amplifier 57, the charging/discharging current detection interface 36, the battery voltage detection interface 37, and the CPU 31 form data acquisition means or status detection means. The CPU 31 and the communication interface 39 form transmission means. The battery voltage detection interface 37 and the CPU 31 form measurement means. The CPU 31 forms remaining capacity calculation means, adjustment means, capacity acquisition means, and computation means. The CPU 31, the breaker control driving interface 34, and the breaker 55 form control means. The CPU 31, the display control section 34 or the display section 54 form display means.

Next, the operation of this embodiment will be described. During a discharging operation, discharging current flows along the path of the batteries 251 and 252, the breaker 55, the battery terminal 58, the electronic apparatus battery terminal 60, the switch circuit 56, and the resistor R32. The CPU 31 of the microcomputer 51 detects the terminal voltage of each of the batteries 251 and 252 via the battery voltage detection interface 37, and detects the temperature within the pack from the thermistor 62 via the temperature detection interface 38. Also, the CPU 31 reads an output voltage of the amplifier 57 at intervals of 10 seconds through the charging/discharging current detection interface 36 and stores it in the RAM 33. Furthermore, the CPU 31 performs various calculations to be described later by using the read data, stores the results, together with the above-described data, within the RAM 33 as transmission data, and transmits this transmission data at intervals of one second in accordance with a communication format such as that shown in FIG. 4 from the communication interface 39 to the electronic apparatus.

Figure 4A:
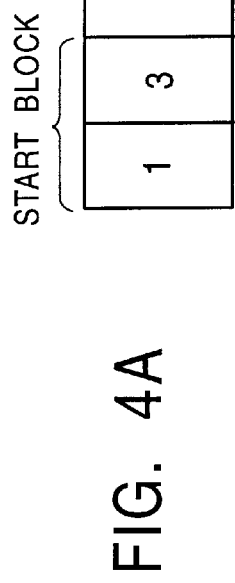
FIGS. 4A and 4B are schematic views showing an example of the structure of transmission data prepared by a communication interface shown in FIG. 3.
Figure 4B:
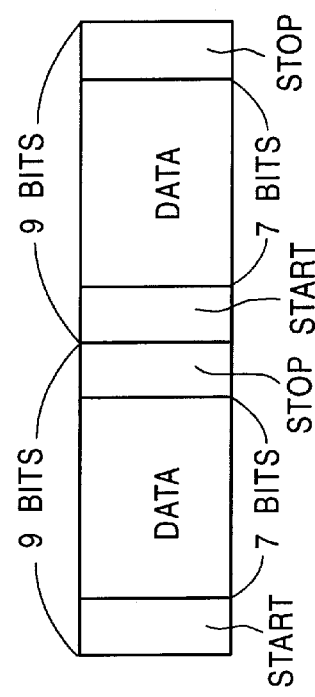

FIGS. 4A and 4B show an example of the communication format prepared by the above-described communication interface. As shown in FIG. 4A, the communication format is 32 bytes in length, with the first two bytes being a start block code such as that shown in FIG. 4B. Thereafter, the third and fourth bytes are a usable time at the load currently applied to the battery pack. The fifth and sixth bytes are a usable time at the minimum load of the previous loads. The seventh byte is a relative state of the capacity. The eighth and ninth bytes are the remaining capacities of the batteries 251 and 252. The tenth byte is the total capacity of the batteries 251 and 252. The eleventh byte is information, such as that shown below, indicating the status 1 of the battery: (1) the end of the battery life (60% of the initial capacity), (2) 80% of the initial capacity, (3) overcharge, (4) overdischarge, (5) over-temperature, and (6) failure of FET1 (FET for charging), (7) failure of FET2 (FET for discharging). The twelfth byte is information, such as that shown below, indicating the status 2 of the battery: (8) charging mode, (9) discharging mode, and (10) unbalance (0.5 V or more) of the terminal voltage of the battery. The last four bits ((10) to (14)) are reserved and not assigned.

The thirteenth byte is the number of charges. The fourteenth byte is the model number. The fifteenth byte is the minimum voltage of this battery. The sixteenth byte is the terminal voltage of the battery 251. The seventeenth byte is the terminal voltage of the battery 252. The eighteenth and nineteenth bytes are the terminal voltage of a battery (not shown) when an expansion is made. The twentieth byte is current which flows through the batteries 251 and 252. The 21st byte is current temperature within the pack. The 22nd byte is the specification (version). The 23rd to 30th bytes are not defined. The 31st and 32nd bytes are an end block code. It is assumed that the model number, the specification, and the calibration values of voltage and current are stored in advance in the ROM 32.

FIG. 5 is a flowchart showing the above-described data transmission operation process for transmitting data to an electronic apparatus of the CPU 31. In the first step 401, the CPU 31 reads and acquires data, such as the voltage and the discharging current of the batteries 251 and 252, and temperature, and using this data, performs a calculation for calculating the remaining capacity of the batteries 251 and 252 and the total capacity and the like of the batteries 251 and 252 after a number of charges/discharges. Then, the transmission data obtained by the calculation is stored in the RAM 33, after which the process proceeds to step 402 where the transmission data is transmitted from the communication interface 39 to the electronic apparatus, then the process proceeds to step 403.

In step 403, the CPU 31 transmits data to the electronic apparatus and then waits for one second. When one second has passed, the process proceeds to step 404 where the transmission data within the RAM 33 is transmitted to the communication interface 39 and the data is transmitted to the main unit from this communication interface 39, after which the process proceeds to step 405. In step 405, the CPU 31 reads the data of the previous time and performs a calculation process thereon, and determines whether or not 10 seconds have passed. When 10 seconds have not passed, the process returns to step 403. When 10 seconds have passed, the process proceeds to step 406 where various data, such as the voltage and the discharging current of the batteries 251 and 252, and temperature, is read and acquired, and a calculation similar to that described above is performed using this data, and then the process returns to step 403.

With such a communication process by the CPU 31, the data is automatically transmitted to the electronic apparatus at intervals of one second, and the transmission data is updated at intervals of 10 seconds. The format of data transmitted by the communication interface 39 and the type of transmission data are as described with reference to FIGS. 4A and 4B. On the other hand, the CPU on the electronic apparatus side only needs to input data, transmitted from the battery pack at intervals of one second, at least once in 10 seconds, and furthermore, is not required to make an inquiry for causing data to be transmitted, to the battery pack as in the conventional case.

Figure 6:
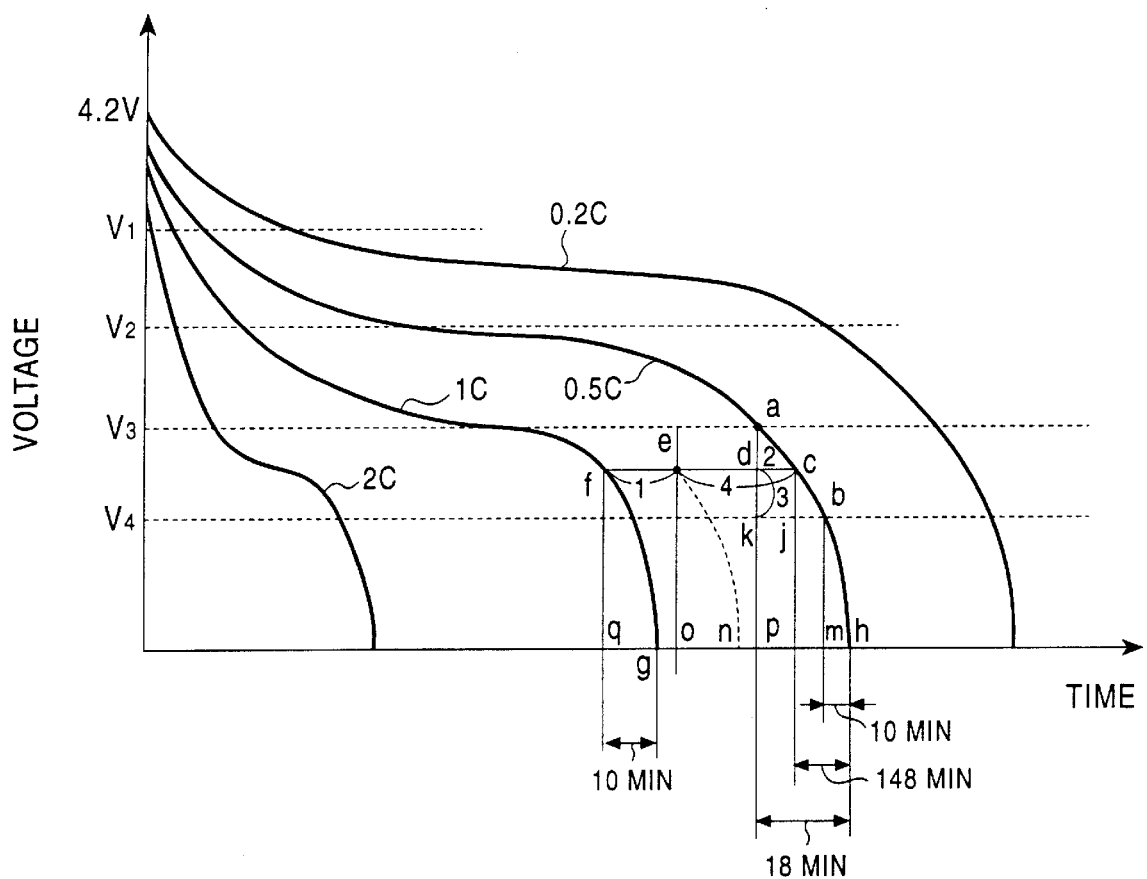
FIG. 6 is a characteristic view illustrating table values for determining a remaining capacity, held in a ROM shown in FIG. 2.

Next, with reference to FIG. 6, a description will be given of a calculation method for calculating the remaining capacity of the batteries 251 and 252 by the CPU 31. FIG. 6 is a characteristic view showing the relationship between a terminal voltage of one battery and the remaining capacity (time) thereof with temperature as a parameter in order to calculate the remaining capacity. The characteristic view of this plurality of parameters (in this embodiment, four parameters 0.2C, 0.5C, 1C, and 2C (C: nominal capacity)) is stored in the ROM 32 in advance as a reference table. This table has been prepared on the basis of experimental data and in practical terms has high accuracy. When, for example, the temperature is 0.5° C., and the terminal voltage of the battery 251 is lowered to $V_4$ (in the case of point b), it can be seen that the remaining capacity is 10 minutes. The CPU 31 determines the remaining capacity by referring to this table and transmits it to the main unit side.

Meanwhile, when it is desired to determine the remaining capacity, for example, at point e which is not on a characteristic line of the above-described table, the CPU 31 performs an interpolation calculation described below. Here, the length (hereinafter, for example, the length between point f and point e is denoted as fe) between the points in the figure is set at fe:ec=1:4 and ad:dk=2:3. When an approximation is made assuming that points a, c, and b are along the same line, since $\Delta$akb and $\Delta$cjb are analogous, there is the relationship kb:jb=5:3. Also, since kb=(18−10), jb=(18−10)×3/5. Therefore, ph=jb+mh=(18−10)×3/5+10=14.8.

At this point, the time of on, which is the remaining capacity at point e, is between time (10 minutes) of qg, which is the remaining capacity at point f, and time (14.8 minutes) of ph, which is the remaining capacity at point c, and furthermore, the amount of increase in the remaining capacity between these points is considered to be nearly directly proportional with respect to the direction of the horizontal axis. The amount of increase in the remaining capacity from point f to point c is (14.8−10) minutes, and point e is at a position such that the distance from point f is 1/5 of the distance to point c. Therefore, the amount of increase in the remaining capacity at point e is (14.8−10)×1/5. Therefore, time on as the total remaining capacity at point e is 10+(14.8−10)×1/5=10.96.

A characteristic table such as that shown in FIG. 6 is provided for each temperature, and adjustments for temperature are also performed by a similar method by using the table for each temperature.

Furthermore, the CPU 31 stores a maximum load during discharges of the previous three times from the immediately When an approximation is made assuming that points a, c, and b are along the same line, since $\Delta$akb and $\Delta$cjb are analogous, there is the relationship kb:jb=5:3. Also, since kb=(18−10)×jb=(18−10)×3/5. Therefore, ph=jb+mh=(18−10)×3/5+10=14.8.

At this point, the time of on, which is the remaining capacity at point e, is between time (10 minutes) of qg, which is the remaining capacity at point f, and time (14.8 minutes) of ph, which is the remaining capacity at point c, and furthermore, the amount of increase in the remaining capacity between these is considered to be nearly proportional along the direction of the horizontal axis. The amount of increase in the remaining capacity from point f to point c is (14.8−10) minutes, and point e is at a position such that the distance from point f is 1/5 of the distance to point c. Therefore, the amount of increase in the remaining capacity at point e is (14.8−10)×1/5. Therefore, time on as the total remaining capacity at point e is 10+(14.8−10)×1/5=10.96.

A characteristic table such as that shown in FIG. 6 is provided for each temperature, and adjustments for temperature are also performed by a similar method by using the table for each temperature.

Furthermore, the CPU 31 stores a maximum load during discharges of the previous three times from the immediately previous one in the RAM 33. The remaining capacity determined on the basis of the actually measured voltage as described above is adjusted by the maximum load during the discharge in order to determine the minimum remaining capacity in units of minutes, and the remaining capacity (the usable shortest time) at the maximum load determined in units of minutes is transmitted to the main unit.

Figure 7:
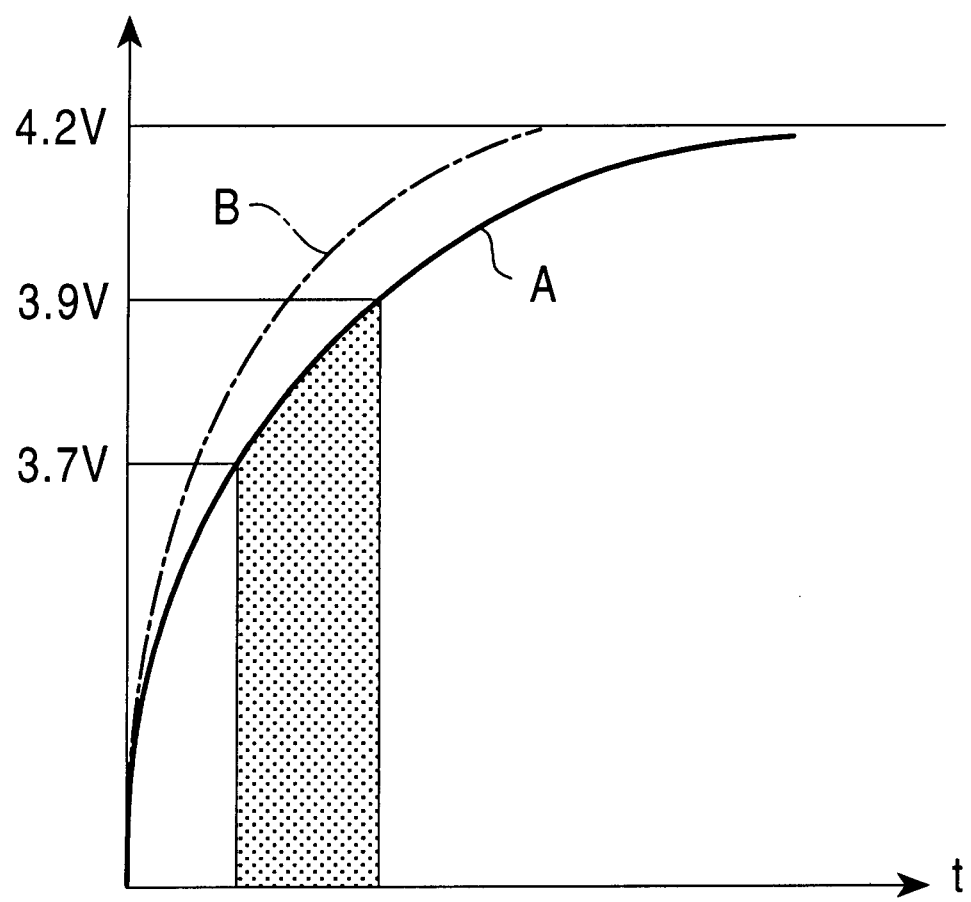
FIG. 7 is a characteristic view illustrating a method of calculation for determining the total capacity of a battery after charging is repeated by the CPU.

Referring to FIG. 7, a description will now be given of a calculation method in which the CPU 31 computes the total capacity after a number of charges of the batteries 251 and 252. When charges/discharges are repeatedly performed in the batteries 251 and 252, the batteries deteriorate, and the total capacity (usable time immediately after charging) decreases gradually. In other words, the charge characteristic curve rises such as curve A of FIG. 7 to curve B, and charging is completed early. Therefore, in order to know the status of the battery, it becomes necessary to determine the total capacity after a number of charges/discharges. For example, the CPU 31 monitors the increase in the terminal voltage of the battery 251 during charging up to a predetermined value in a particular range, determines the capacity (mAh) charged during this time on the basis of the time required for the terminal voltage to increase to a predetermined value in this range and the charging current value at that time, compares this capacity with the initial capacity value obtained by performing a process similar to that of the first time, and determines the present total capacity by using this comparison value.

As shown in FIG. 7, the voltage range in which an increase in the terminal voltage is monitored is in a range of 3.7 V to 3.9 V (predetermined value). First, an initially charged capacity X0 of the battery 251 from 3.7 V to 3.9 V is stored in the ROM 32 for each charging current, and the initial total capacity W0 of this battery 251 is also stored therein. Here, if the charging current when the number of charges is the n-th time is denoted as "in", the charging capacity is denoted as "Xn", and the charging time is denoted as "tn", then Xn=in×tn. Also, the initially charged capacity X0 at the time of the charging current "in" is read from the ROM 32. The total capacity Wn when the number of charges is the n-th time is Wn=W0×Xn/X0. The CPU 31 computes this total capacity Wn each time the number of charges is updated, and transmits this capacity to the main unit of the electronic apparatus.

Also, if the reference voltage for detecting overvoltage (overcharge) for the batteries 251 and 252 is V0, a value V1 of (V0−threshold voltage), that is, a value V1 which is lower by a predetermined threshold voltage (for example, 0.5 V) than the reference voltage V0 is stored in the ROM 32 in advance. The CPU 12 stores a value such that 0.5 V is added to the reference voltage V1 read from the ROM 32, that is, V0V, in the RAM 33, and performs normal overcharge detection by using the reference voltage V0 within the RAM 33.

Meanwhile, in order to cause the microcomputer 51 to operate normally, a minimum voltage must be supplied thereto. If the voltage of the battery is decreased to less than that, the operation of the microcomputer 51 becomes unstable. If the CPU 31 should be reset due to a low voltage, the reference voltage V0 within the RAM 33 is also cleared. However, when the CPU 31 is reset, that is, when the reference voltage V0 within the RAM 33 is cleared, thereafter, the CPU 31 performs overcharge detection of the batteries 251 and 252 on the basis of the reference voltage V1 within the ROM 32 lower by 0.5 V. For this reason, overcharge detection takes place early by an amount corresponding to this decrease of 0.5 V. Before the reference voltage V0 is reached, the fuse of the breaker 55 blows via the breaker control driving interface 40 of FIG. 3, causing the charging current to be shut off. That is, the entire operation within the battery pack is stopped where it is safe (charging is stopped before the battery is damaged due to overcharge).

Unlike that described above, a threshold voltage (0.5 V) may also be stored in the RAM 33. In this case, the CPU 31, at normal times, detects an overvoltage of the terminal voltage of the batteries 251 and 252 by using the reference voltage V0 obtained by adding the threshold voltage (0.5 V) stored in the RAM 33 to the reference voltage V1 stored in the ROM 32, and performs overcharge protection control for these batteries. However, when the storage of the RAM 33 is deleted due to the low voltage of the batteries 251 and 252, thereafter, performs overvoltage detection of the battery by using the reference voltage V1 stored in the ROM 32, so that the fuse of the breaker 55 blows so that the entire operation within the battery pack, including the CPU itself, stops where it is safe in the same way as that described above.

FIGS. 8A, 8B, and 8C are views showing the exterior of this battery pack 35, with a display section 54, formed of an LCD, provided on the surface thereof. FIGS. 8A and 8B are respectively a plan view and a side view of the battery pack 35. FIG. 8C is an enlarged view of the display section. A writing section 71 to which a memo can be written by a user with an ordinary writing tool is provided on the surface of the battery pack 35, with the display section 54 being provided adjacent thereto.

The CPU 31 causes the display control section 34 to display a capacity on a display section 351, shown in FIG. 8C, of the display section 54. That is, when the capacity is full, all of this plurality of display sections 351 are lit, and when the capacity runs short, the display is made in such a way that the display sections 351 are shut off in sequence starting from the right. The display sections 351 are such that one of them corresponds to a predetermined time, for example, 10 minutes. Also, a display section 352 is made to blink during charging, indicating that charging is being performed. When the total capacity becomes 60% of the initial value, a display section 353 is lit and displayed, informing that the battery life has ended. Also, each time the number of charges exceeds 10, a plurality of display sections 354 are lit and displayed in sequence starting from the left, displaying the number of times that charging has been performed.

According to this embodiment, the CPU 31 of the battery pack 35 sends data at intervals of one second to the main unit side, only needs to update this data once in 10 seconds, and is not required to prepare transmission data and to wait for an inquiry from the CPU on the main unit side, which performs high-speed processing. Therefore, even if the operating clock thereof is decreased from the conventional 4 MHz to 38.4 kHz, the CPU 31 can perform the communication operation satisfactorily. As such a CPU 31, an inexpensive one can be used, and the cost of the battery pack 35 can be reduced. Also, the current which is supplied to the CPU is less required from the conventionally required 4 mA through 7 mA to 30 $\mu$A by an amount corresponding to that by which the operating clock of the CPU 31 is decreased, making it possible to greatly reduce the consumption of power. Also, the CPU on the main unit side only needs to input data transmitted at intervals of one second from the battery pack side once in 10 seconds, and is not required to make an inquiry for causing data to be transmitted as in the conventional case to the battery pack side. Therefore, the process of inputting the data is less of a burden, and other processing can be performed efficiently by an amount corresponding to the reduced burden.

Since the remaining capacity calculation of the batteries 251 and 252 is performed using an actually measured value table in which the relationship between the terminal voltage of the battery and the remaining capacity (time) thereof is formed into a characteristic view with a plurality of nominal capacities and temperatures as parameters, and since the remaining capacity from the terminal voltage, which is not in the actually measured value table, can be obtained by performing an interpolation calculation, either one adjustment only is performed in the calculation process or none at all are performed. Therefore, the remaining capacity of the batteries 251 and 252 can be determined easily and with high accuracy. Furthermore, since the remaining capacity at the maximum load such that the remaining capacity determined in this way is adjusted by the maximum load in the previous three times of charging is determined in time units (minutes) and this is transmitted to the main unit side and displayed in the main unit or displayed on the display section 54 of the battery pack, it is possible for the user to intuitively know how long the batteries 251 and 252 can last in the worst case.

In addition, the total capacity of the batteries 251 and 252 after charging is repeated is determined by comparing the capacity charged, while, for example, the terminal voltage of the secondary battery 251 which is being charged is increased by a predetermined voltage, with the capacity of the initial value and by calibrating the total capacity of the initial value by this comparison result. Thus, it is possible to determine the remaining capacity of the batteries 251 and 252 with higher accuracy than in the conventional ΔV method.

Also, the reference voltage for detecting an overvoltage is stored in the ROM 32 in such a way that it is lower by 0.5 V, this is adjusted to be higher by 0.5 V and stored in the RAM 33, so that normal overvoltage detection is performed, thereby the CPU 31 is reset at a load voltage, and the RAM 33 is cleared. Thereafter, the CPU 31 detects the overvoltage by the reference voltage of the ROM 32, thereby overvoltage detection is performed early, and the entire charging operation of the battery pack can be stopped where it is safe.

Furthermore, the CPU 31 causes various data relating to the status of the battery, such as the battery capacity, the display during charging, and the life of the battery to be constantly and automatically displayed on the display section 54, making it possible to always provide this data to the user without burdening the user. Also, the data can be displayed even if the battery pack is not loaded into the main unit or a charger. Since the data is always displayed on the display section 54 in this way, the consumption of power of the CPU 31 is reduced, and the display section 54 is formed of an LCD or the like with a small amount of power consumption, even if the power is consumed by the display, the capacity of the batteries 251 and 252 is not reduced to less than that in the conventional case because of the constant consumption of the batteries 251 and 252.

As has been described, according to the battery pack and the communication method of the present invention, since data relating to the status and charge/discharge of the secondary battery is transmitted in one direction independently of control from an electronic apparatus, it is possible to perform a transmission operation by using an inexpensive microcomputer for low-speed processing and with reduced power.

According to the battery pack and the remaining capacity calculation method of the present invention, since the remaining capacity of the secondary battery is determined by the data and using actually measured data with time being the unit, it is possible to improve the accuracy of the remaining capacity with time of the secondary battery being the unit.

According to the battery pack of the present invention, since the remaining capacity of the secondary battery is determined by one interpolation calculation, it is possible to improve the accuracy of the remaining capacity with the time of the secondary battery being the unit.

According to the battery pack and the remaining capacity calculation method of the present invention, since the remaining capacity of the secondary battery at the maximum load is determined by adjusting the remaining capacity determined with time being the unit by the maximum load in the repetition number of the previous n discharges, it is possible for the user to intuitively know the capacity of the secondary battery at this maximum load.

According to the battery pack and the total capacity calculation method of the present invention, since the present total capacity of the secondary battery is determined on the basis of an actually measured capacity charged in the secondary battery while the terminal voltage of the secondary battery is increased by a voltage in a predetermined range during the charging of the secondary battery, the calculation for determining the total capacity is made easy and the accuracy can be improved.

According to the battery pack and the overcharge protection method of the present invention, since, after the volatile storage is volatized due to the low voltage of the secondary battery, the overvoltage of the secondary battery is detected using a reference voltage lower than a normal reference voltage, it is possible to perform the overcharge control of the secondary battery in such a case reliably and where it is safe.

According to the battery pack and the information display method of the present invention, since data relating to the status and charge/discharge of the secondary battery is always displayed automatically in the battery pack, even if the battery pack is not loaded into the electronic apparatus, it is possible for the user to see the data without burden.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A battery pack, comprising:
    a battery pack for supplying power to an electronic apparatus;
    data acquisition means for acquiring data relating to the status and charge/discharge of said battery, said data acquisition means comprising a processor and memory; and
    transmission means for transmitting in one direction the data acquired by said data acquisition means to said electronic apparatus independently of clock operation of and control by said electronic apparatus,
    wherein said data acquisition means acquires said data at predetermined first intervals and updates the data, and said transmission first intervals and updates the data, and said transmission means transmits the data acquired by said data acquisition means to said electronic apparatus at predetermined second intervals which are shorter than said predetermined first intervals.

2. A battery pack according to claim 1, wherein said first intervals are 10 seconds long and said second intervals are 1 second long.

3. A battery pack according to claim 1, wherein said data acquisition means performs computations by using acquired data and uses the data resulting from said computations also as the transmission data.

4. A communication method for transmitting data relating to a battery which supplies power to an electronic apparatus, and data relating to the status and charge/discharge of said battery, to an electronic apparatus using said battery as a power source, said communication method comprising the steps of:
   acquiring and storing said data in said battery at predetermined first intervals using a processor and memory; and
   transmitting in one direction the acquired data to said electronic apparatus at predetermined second intervals shorter than said predetermined first intervals, said transmission taking place independently of clock operation of and control by the electronic apparatus.

5. A battery pack, comprising:
   a battery for supplying power to an electronic apparatus;
   storage means for storing a table in which data is held for determining a remaining battery capacity from the terminal voltage of said battery with time being the unit;
   measurement means for measuring the terminal voltage of said battery;
   remaining capacity calculation means for determining the remaining capacity of said battery on the basis of said terminal voltage measured by said measurement means by referring to data of the table within said storage means with time being the unit, said remaining capacity means including an operatively programmed processor; and
   transmission means for transmitting in one direction the data acquired by said data acquisition means to said electronic apparatus independently of clock operation of and control by said electronic apparatus,
   wherein said data acquisition means acquires said data at predetermined first intervals and updates the data in said tables, and said transmission means transmits the data acquired by said data acquisition means to said electronic apparatus at predetermined second intervals which are shorter than said predetermined first intervals.

6. A battery pack according to claim 5, wherein said remaining capacity calculation means determines the remaining capacity of said battery by interpolating data held in said table with respect to the terminal voltage of said battery measured by said measurement means, which is not held in said table.

7. A battery pack, comprising:
   a battery for supplying power to an electronic apparatus;
   measurement means for measuring a terminal voltage of said battery;
   remaining capacity calculation means for determining the remaining battery capacity value on the basis of the terminal voltage of said battery;
   storage means for storing a maximum load in n previous discharges, n being a predetermined number; and
   adjustment means for adjusting the remaining battery capacity value determined by said remaining capacity calculation means in view of the maximum load stored in said storage means by determining a value for the remaining capacity of said battery at the maximum load.

8. A remaining capacity calculation method for determining a remaining capacity of a battery, said remaining capacity calculation method comprising:
   measuring the terminal voltage of said battery;
   determining the remaining battery capacity of said battery from said terminal voltage and generating a battery capacity value; and
   adjusting said remaining battery capacity value in view of a maximum load during a previous n discharges by determining a value for the remaining capacity of said battery at the maximum load, n being a predetermined number.

9. A battery pack, comprising:
   a secondary battery for supplying power to an electronic apparatus;
   storage means for, during an initial charging of said secondary battery, storing an initial capacity as a capacity charged in said secondary battery while the terminal voltage thereof is increased from a first reference voltage E1V to a second reference voltage E2V, and the initial total capacity as the total capacity during the initial charging of said secondary battery;
   capacity acquisition means for, during the charging of said secondary battery, determining the capacity charged in said secondary battery while the terminal voltage thereof is increased from said first reference voltage E1V to said second reference voltage E2V; and
   computation means for computing the present total capacity of said secondary battery on the basis of said capacity determined by said capacity acquisition means, said initial capacity, and said initial total capacity stored in said storage means.

10. A total capacity calculation method for determining the total capacity of a secondary battery at the present time, said total capacity calculation method comprising:
   a storing step of, during the initial charging of said secondary battery, storing the initial capacity as the capacity charged in said secondary battery while the terminal voltage thereof is increased from a first reference voltage E1V to a second reference voltage E2V, and storing the initial total capacity as the total capacity during the initial charging of said secondary battery; and
   a step of, during the charging of said secondary battery, determining the capacity charged in said secondary battery while the terminal voltage thereof is increased from said first reference voltage E1V to said second reference voltage E2V, and computing the present total capacity of said secondary battery on the basis of said determined capacity, said prestored initial capacity, and initial total capacity.

11. A battery pack, comprising:
   a secondary battery for supplying power to an electronic apparatus;
   detection means for detecting the terminal voltage of said secondary battery;
   shut-off means for, when the terminal voltage of said secondary battery becomes an overvoltage, shutting off the charging current to said secondary battery;
   nonvolatile first storage means in which is stored a first reference voltage for detecting an overvoltage of said secondary battery;
   volatile second storage means in which is stored a second reference voltage for detecting an overvoltage of said secondary battery; and
   control means for determining, at normal times, an overvoltage of the terminal voltage of said secondary battery detected by said detection means at least by using said second reference voltage stored in said second storage means, and when the voltage of said secondary battery is decreased and the storage of said second storage means is deleted, determining an overvoltage of the terminal voltage of said secondary battery by using said first reference voltage stored in said first storage means, controlling said shut-off means in accordance with the determination result, and shutting off the charging current of said secondary battery, when the voltage of the secondary battery exceeds said first reference voltage.

12. A battery pack according to claim 11, wherein said first voltage is lower by a predetermined threshold voltage than a reference voltage for detecting an overvoltage of said secondary battery at normal times.

13. A battery pack according to claim 12, wherein said second reference voltage is said threshold voltage, and said control means determines, at normal times, an overvoltage of the terminal voltage of said secondary battery detected by said detection means by comparing it with the sum of said first reference voltage stored in said first storage means and said threshold voltage stored in said second storage means, and when the voltage of said secondary battery is decreased and the storage of said second storage means is deleted, determines an overvoltage of the terminal voltage of said secondary battery by comparing it with said first reference voltage stored in said first storage means.

14. A battery pack according to claim 12, wherein said second reference voltage is equal to the sum of said first reference voltage and said threshold voltage, and said control means determines, at normal times, an overvoltage of the terminal voltage of said secondary battery detected by said detection means by comparing it with said second reference voltage stored in said second storage means, and when the voltage of said secondary battery is decreased and the storage of said second storage means is deleted, determines an overvoltage of the terminal voltage of said secondary battery by comparing it with said first reference voltage stored in said first storage means.

15. An overcharge protection method for protecting a battery pack from overcharge, said battery pack comprising a secondary battery for supplying power to an electronic apparatus, and a shut-off section for, when a terminal voltage of said secondary battery becomes an overvoltage, shutting off the charging current to said secondary battery, said overcharge protection method comprising:

a step of storing a first reference voltage for detecting an overcharge of said secondary battery in a nonvolatile storage section;

a step of storing a second reference voltage for detecting an overcharge of said secondary battery in a volatile storage section; and another step of determining, at normal times, an overcharge of said secondary battery at least by using said second reference voltage, when the voltage of said secondary battery is decreased and said second reference voltage is deleted, determining an overcharge of said secondary battery by using said first reference voltage stored in said nonvolatile storage means, controlling said shut-off means in accordance with the determination result, and shutting off the charging current of said secondary battery.

* * * * *